(12) United States Patent
Kogler et al.

(10) Patent No.: US 11,387,081 B2
(45) Date of Patent: Jul. 12, 2022

(54) WAFER CHUCK AND PROCESSING ARRANGEMENT

(71) Applicant: Infineon Technologies AG, Neubiberg (DE)

(72) Inventors: Rudolf Kogler, Velden (AT); Juergen Steinbrenner, Noetsch im Gailtal (AT); Wolfgang Dastel, Villach (AT); Harald Huetter, Baldramsdorf (AT); Markus Kahn, Rangersdorf (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/798,445

(22) Filed: Feb. 24, 2020

(65) Prior Publication Data
US 2020/0251314 A1   Aug. 6, 2020

Related U.S. Application Data

(62) Division of application No. 15/412,131, filed on Jan. 23, 2017, now Pat. No. 10,629,416.

(51) Int. Cl.
*H01J 37/32* (2006.01)
*H01L 21/687* (2006.01)
(Continued)

(52) U.S. Cl.
CPC .... *H01J 37/32715* (2013.01); *C23C 16/4583* (2013.01); *C23C 16/4585* (2013.01); *C23C 16/4586* (2013.01); *C23C 16/50* (2013.01); *C23C 16/503* (2013.01); *C23C 16/505* (2013.01); *H01J 37/32027* (2013.01); *H01J 37/32082* (2013.01); *H01J 37/32697* (2013.01); *H01L 21/67034* (2013.01); (Continued)

(58) Field of Classification Search
USPC .......... 118/728, 729, 730, 732, 500; 156/345.51, 345.11, 345.47
See application file for complete search history.

(56) References Cited

U.S. PATENT DOCUMENTS

| 10,629,416 B2 * | 4/2020 | Kogler ............ H01L 21/68742 |
| 2003/0106646 A1 | 6/2003 | Ma et al. |

(Continued)

FOREIGN PATENT DOCUMENTS

| CN | 102144280 A | 8/2011 |
| CN | 103681415 A | 3/2014 |
| KR | 20040103728 A | 12/2004 |

OTHER PUBLICATIONS

Chinese Office Action issued for corresponding GN patent application No. CN 201810064105, dated Nov. 3, 2020, 8 pages (for informational purposes only).
(Continued)

*Primary Examiner* — Yewebdar T Tadesse
(74) *Attorney, Agent, or Firm* — Viering, Jentschura & Partner mbB

(57) ABSTRACT

According to various embodiments, a wafer chuck may include at least one support region configured to support a wafer in a receiving area; a central cavity surrounded by the at least one support region configured to support the wafer only along an outer perimeter; and a boundary structure surrounding the receiving area configured to retain the wafer in the receiving area.

9 Claims, 10 Drawing Sheets

(51) Int. Cl.
*C23C 16/50* (2006.01)
*C23C 16/503* (2006.01)
*C23C 16/505* (2006.01)
*H01L 21/67* (2006.01)
*C23C 16/458* (2006.01)

(52) U.S. Cl.
CPC .. *H01L 21/67069* (2013.01); *H01L 21/68735* (2013.01); *H01L 21/68742* (2013.01); *H01L 21/68785* (2013.01); *H01J 2237/334* (2013.01); *H01J 2237/335* (2013.01); *H01J 2237/338* (2013.01); *H01J 2237/3321* (2013.01)

(56) References Cited

U.S. PATENT DOCUMENTS

| | | | |
|---|---|---|---|
| 2007/0089836 A1* | 4/2007 | Metzner | H01L 21/68735 156/345.51 |
| 2010/0055318 A1 | 3/2010 | Volf et al. | |
| 2014/0083461 A1 | 3/2014 | Shih et al. | |
| 2016/0049323 A1* | 2/2016 | Ye | H01L 21/68757 361/234 |

OTHER PUBLICATIONS

Chinese Search Report issued for the corresponding Chinese patent application No. 201810064105.1, dated Apr. 20, 2022, 10 pages (for informational purposes only).

* cited by examiner

FIG. 6

Determining a wafer bow of a wafer under conditions that the wafer is only supported in an edge region of the wafer via a support region of a wafer chuck, wherein the wafer chuck includes a recessed region surrounded by the support region, the recessed region including a bottom surface facing the wafer and providing a gap between the bottom surface of the recessed region and a inner region of the wafer surrounded by the edge region of the wafer

Adapting a shape of the bottom surface based on the determined wafer bow to provide an equidistant arrangement of the inner region of the wafer relative to the bottom surface of the recessed region in the case that the wafer is placed on the wafer chuck

WAFER CHUCK AND PROCESSING ARRANGEMENT

RELATED APPLICATION(S)

This application is a Divisional of U.S. patent application Ser. No. 15/412,131, filed Jan. 23, 2017, which is incorporated herein by reference in its entirety.

TECHNICAL FIELD

Various embodiments relate generally to a wafer chuck and a processing arrangement.

BACKGROUND

In general, a wafer may be processed in various types of processing tools. Therefore, the wafer may be positioned in the processing tool via a wafer chuck. Various types of wafer chucks may be already know. However, a conventionally used wafer chuck may be designed to contact a backside of a wafer physically, wherein a main processing surface, also referred to as a front side, of the wafer faces away from the wafer chuck. In the processing tool, the front side of the wafer may be processed as desired. The processing via the processing tool may include a processing in a plasma, wherein the wafer chuck may be configured as an electrode to apply a bias voltage and/or a voltage for generating the plasma.

SUMMARY

According to various embodiments a wafer chuck may include at least one support region configured to support a wafer in a receiving area, a central cavity surrounded by the at least one support region configured to support the wafer only along an outer perimeter, and a boundary structure surrounding the receiving area configured to retain the wafer in the receiving area.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a schematic flow diagram of a method for processing a wafer, according to various embodiments;

DESCRIPTION

Figure 1A:
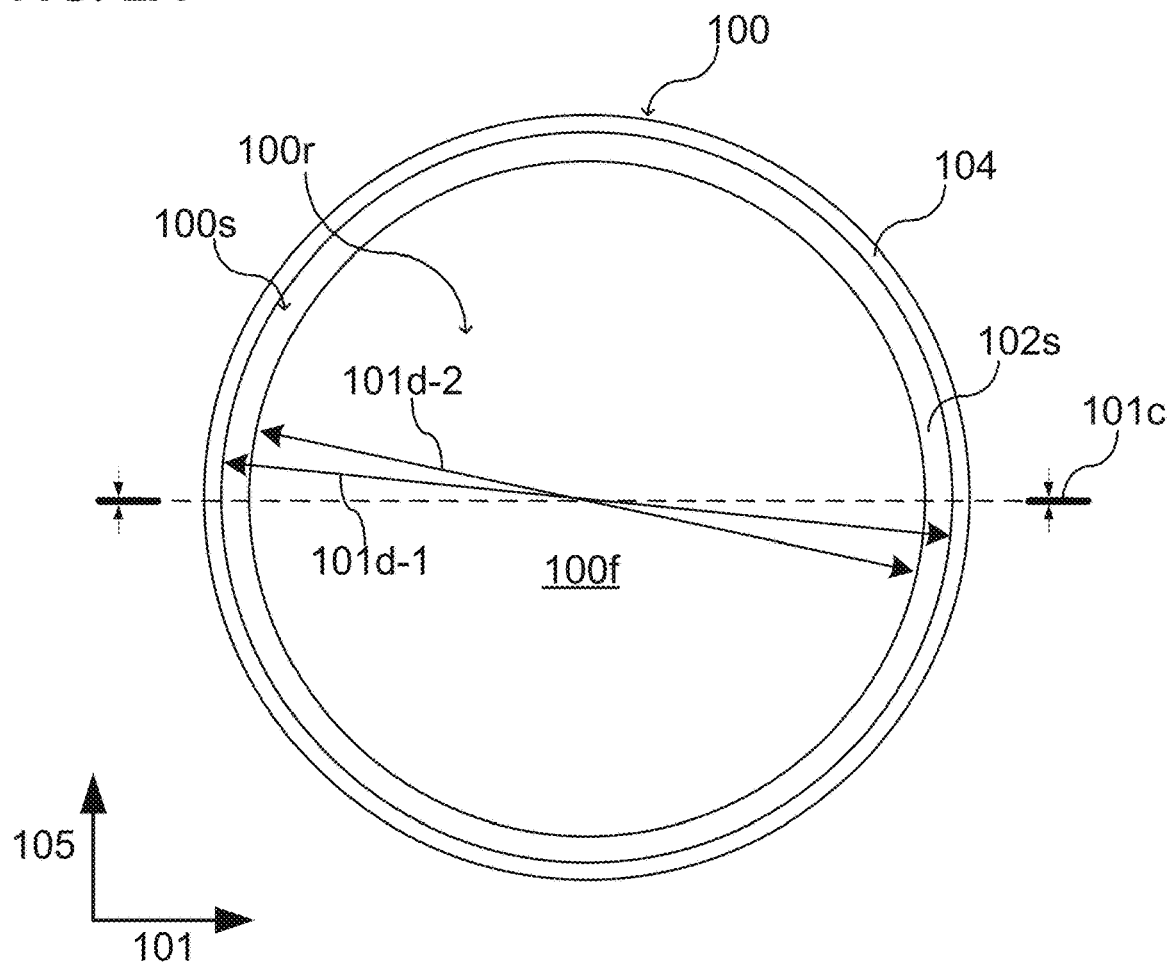
FIGS. 1A and 1B show a wafer chuck in a schematic top view and a corresponding cross-sectional view, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of with regard to a group of elements may be used herein to mean at least one element from the group consisting of the elements. For example, the phrase" at least one of with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to the "lateral" extension of a structure (or of a structure element) provided on or in a carrier (e.g. a layer, a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer.

The term "coupled" is used herein to mean electrically connected, which may include a direct connection or an indirect connection, wherein an indirect connection may only include additional structures in the current path that not influence the substantial functioning of the described circuit or device.

According to various embodiments, the term wafer used herein may include any suitable type of substrate having a plate-shape. The wafer may have diameter or lateral extension greater than about 10 cm, e.g. in the range from about 10 cm to about 50 cm, or even greater than 50 cm. The wafer may have a thickness in the range from about 50 µm to about 1 mm, e.g. in the range from about 50 µm to about 750 µm.

According to various embodiments, the wafer may be a semiconductor wafer. According to various embodiments, the semiconductor wafer may be made of silicon or may include silicon. However, other semiconductor materials of various types may be used in a similar way, e.g. germanium, Group III to V (e.g. SiC), or other types, including for example polymers. In an embodiment, the semiconductor wafer includes doped semiconductor material (e.g. p-type doped or n-type doped semiconductor material). According to various embodiments, the semiconductor wafer may be a semiconductor (e.g. silicon) on insulator (SOI) wafer. The semiconductor on insulator (SOI) wafer may include a body region, an insulator region over the body region, and a semiconductor region over the insulator region, the insulator region is configured to separate (e.g. spatially and/or electrically) the body region from the semiconductor region. The semiconductor region may include a semiconductor material (e.g. silicon). The body region may also include a semiconductor material (e.g. silicon). The insulator region may include one or more cavities and/or one or more insulating layers (e.g. oxide layers).

The term "plasma" used with regards to "a plasma processing" may be a low pressure plasma generated in a vacuum chamber. Plasma processing may include various different types of processing, e.g. plasma deposition, plasma etching, plasma cleaning, plasma functionalization, and the like. Plasma deposition may include for example plasma enhanced chemical vapor deposition and physical vapor deposition processes based on evaporating a metal via a plasma, e.g. sputter deposition, vacuum plasma-spraying, and the like. Plasma etching may include for example reactive ion etching. There may be in general various different ways to generate a plasma, e.g. via an inductively coupled plasma (ICP) source or via a capacitively coupled plasma (CCP) source. The plasma may be generated directly in the surrounding of a wafer to be processed, e.g. plasma may be generated in a processing region to which the wafer is exposed, or remotely, via a so-called remote plasma source.

According to various embodiments, a wafer chuck is provided for processing (e.g. depositing or etching) a backside of a wafer. In this case, the front side of the wafer may include for example already processed semiconductor structures (e.g. transistors, diodes, memory structures, metal lines, or any other type of semiconductor structures) that shall not be damaged (e.g. the defect density may increase or a possibility of an electrical failure during operating the semiconductor structures may be increased) during the processing of the backside of the wafer.

Several technologies may require forming a material layer (e.g. a metal layer, an insulator layer, or any other layer) at the backside of a wafer. Conventionally used deposition tools may manipulate the wafer with its front side upside down for such a backside processing. Therefore, a defect formation on the active front side of the wafer cannot be avoided due to mechanical contact with handling elements, e.g. with robot plates, and the like. Further, mechanical contact to a wafer chuck, where, for example, the wafer is placed on for deposition in the coating chamber, causes even more damage to the front side of the wafer.

Depending on the level of the front side processing of the wafer, a sacrificial scratch protection layer may be conventionally used on its (e.g. active) front side. If the front side of the wafer is already metallized, e.g. with aluminum or an aluminum alloy, e.g. AlSiCu, or any other suitable metal, using a thin layer as scratch protection will fail on the soft metal lines when mechanical contact happens. Since the bearing strength of a soft metal is low, the hard scratch protection layer may be punched into the metal when local contact with a wafer chucks occur. Further, the processing of the backside of the wafer may include heating the wafer and/or placing the wafer into a vacuum chamber, so that for example conventionally used protection layers, e.g. protection foils or resist layers, may cause problems during processing. In some cases, the removal of the sacrificial scratch protection may be impossible.

According to various embodiments, a wafer chuck is provided that allows the deposition of layers at the backside of the wafer on wafer level, while the active front side of the wafer remains untouched by the chuck. Without loss of generality, the front side of the wafer is referred to herein as the side of the wafer facing the wafer chuck, wherein the backside of the wafer, facing away from the wafer chuck, is to be processed while the wafer is placed on the wafer chuck. Without loss of generality, the wafer that shall be placed on the wafer chuck may have two regions, an inner region (also referred to as active region, device region, etc.) and an edge region surrounding the inner region. The edge region may be an unproductive region, e.g. the edge region may not be used for forming semiconductor devices. Corresponding to the edge region and the inner region, the surface of the wafer facing the wafer chuck (e.g. the front side) may have two surface regions, an inner surface region and an edge surface region surrounding the inner surface region, see FIGS. 8A and 8B. According to various embodiments, the edge region of the wafer defines an outer perimeter of the wafer.

According to various embodiments, a wafer chuck may be provided that is designed in accordance with at least one, a plurality of, or all of the following aspects:

the wafer may touch the wafer chuck only at its (e.g. unproductive) edge region; the edge region may be for example an outer rim of the wafer having a radial extension of up to several millimeters depending on the diameter of the wafer and the active chip area dimensions surrounded by the edge region);

the wafer chuck may be configured to provide a gap (also referred to herein as cavity) between the front side of the wafer facing the wafer chuck and the wafer chuck;

the wafer chuck may be vacuum capable (i.e. the wafer chuck may be configured to allow venting the gap when the wafer is placed on the wafer chuck);

the gap may be configured to maintain a minimum distance between the front side of the wafer and the wafer chuck at different wafer stress conditions, resulting in a wafer bow (e.g. convex or concave), the wafer bow may change caused by film stress, temperature stress and/or a different pressure in the gap compared to the processing chamber;

the gap may be configured to allow a PE-CVD process carried out via the wafer chuck; i.e. a parasitic plasma formation between the front side of the wafer and the wafer chuck may be prevented or in other words, the gap may be configured (e.g. with a height less than about 1 mm) to suppress a plasma formation inside the gap;

the wafer chuck may be heatable (e.g. via a lamp heater or a resistive heater) and/or may include a heating structure;

lift pins (as part of the handling system) may be used for handling the wafer, e.g. contacting the wafer in the edge region of the wafer; therefore, the lift pins may operate in the support region of the wafer chuck, where the wafer is placed during processing;

the wafer chuck may be configured to be compatible with every platform and every processing chamber from the equipment suppliers by simply exchanging the chuck and the corresponding lift pin manipulation; therefore, the wafer chuck may be mounted to PE-CVD (plasma enhanced chemical vapor deposition), SA-CVD (sub atmospheric (pressure) chemical vapor deposition) and PVD (physical vapor deposition) platforms;

the wafer chuck may include (e.g. may be coated) with a ceramic layer to protect the wafer chuck from plasma damage and/or chemical attack during processing;

the wafer chuck may include an electrical conductive core (e.g. a metal grid, a solid disk, etc.), which may be connected to the tool ground, or alternatively, the electrical conductive core may be biased and/or used as a hot electrode; alternatively, the electrical conductive core may be configured electrically floating.

in the case that the wafer chuck is used in plasma processing tool, the plasma can be maintained by at least one of RF, DC or pulsed DC power; the plasma power can be generated capacitively or inductively coupled;

the wafer chuck may be mounted in the processing chamber to allow a vertical movement of the wafer chuck, e.g. for wafer handling reasons and/or in order to tune electrode distances.

According to various embodiments, the wafer chuck 100 may consist of electrically conductive material or may consist of dielectric material. According to various embodiments, a dielectric wafer chuck 100 may be used, for example, for processing a wafer via in an ICP source. According to various embodiments, the dielectric wafer chuck 100 may be used, for example, for processing a wafer via a PVD process to support the wafer electrically floating. Alternatively, the wafer chuck 100 (e.g. a dielectric wafer chuck 100) may be used only as a heater in a processing tool.

According to various embodiments, a mechanical part, e.g. a wafer chuck or baseplate, is provided, upon which the wafer is placed for backside deposition. The backside of the wafer is facing away from the wafer chuck and the front side of the wafer is only mechanically contacted within an edge region of the wafer. During backside deposition, only the edge region of the wafer is in contact with the wafer chuck or the baseplate.

Figure 1B:
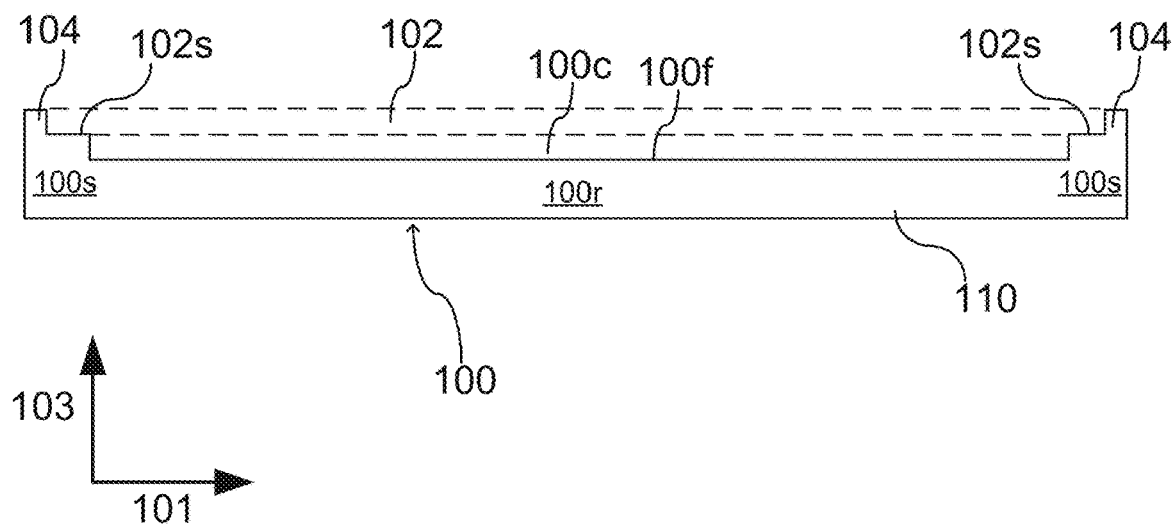

FIG. 1A illustrates a wafer chuck 100 in a schematic top view and FIG. 1B shows a cross-sectional view of the wafer chuck 100 along the cross-section line 101c. The wafer chuck 100 described in the following is illustrated in a circular shape for receiving, for example, a wafer having a circular shape as well. However, the wafer chuck may be adapted to fit any shape of a wafer to be handled via the wafer chuck. If the wafer has for example a square shape, the wafer chuck has a square shape as well (e.g. with or without cut corners; or with or without rounded corners), and the like.

According to various embodiments, the wafer chuck 100 may include at least one support region 100s configured to support a wafer 106 in a receiving area 102. The wafer chuck 100 may further include a central cavity 100c surrounded by the at least one support region 100s. The at least one support region 100s may be configured to support the wafer 106 only along an outer perimeter. The wafer 106 may be supported along the entire outer perimeter or at more than one positions (spatially separated from each other) along the outer perimeter.

Illustratively, the central cavity 100c and the at least one support region 100s may be configured so that the wafer 106 is only supported in an edge region 106e of the wafer and that an inner region 106i of the wafer 106 is exposed (or in other words not physically contacted). In other words, an edge surface region of the wafer 106 is in physical contact with the at least one support region 100s and an inner surface region of the wafer 106 facing the wafer chuck 100 and surrounded by the edge surface region is disposed over the central cavity 100c.

Figure 1C:
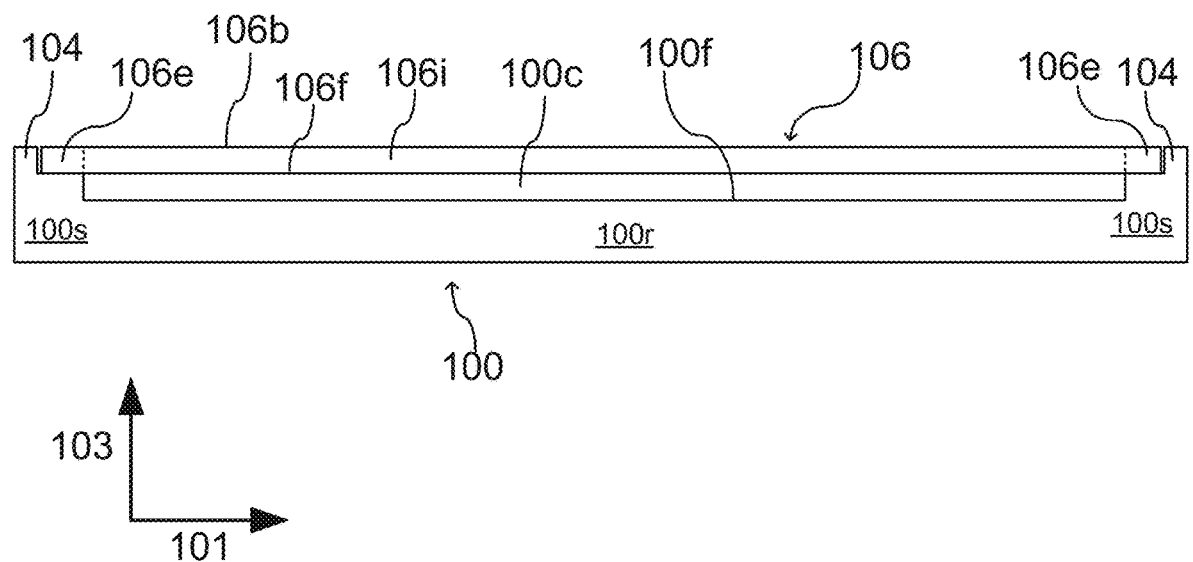
FIG. 1C shows a wafer chuck and a wafer placed on the wafer chuck in a schematic cross-sectional view, according to various embodiments.
Figure 8A:
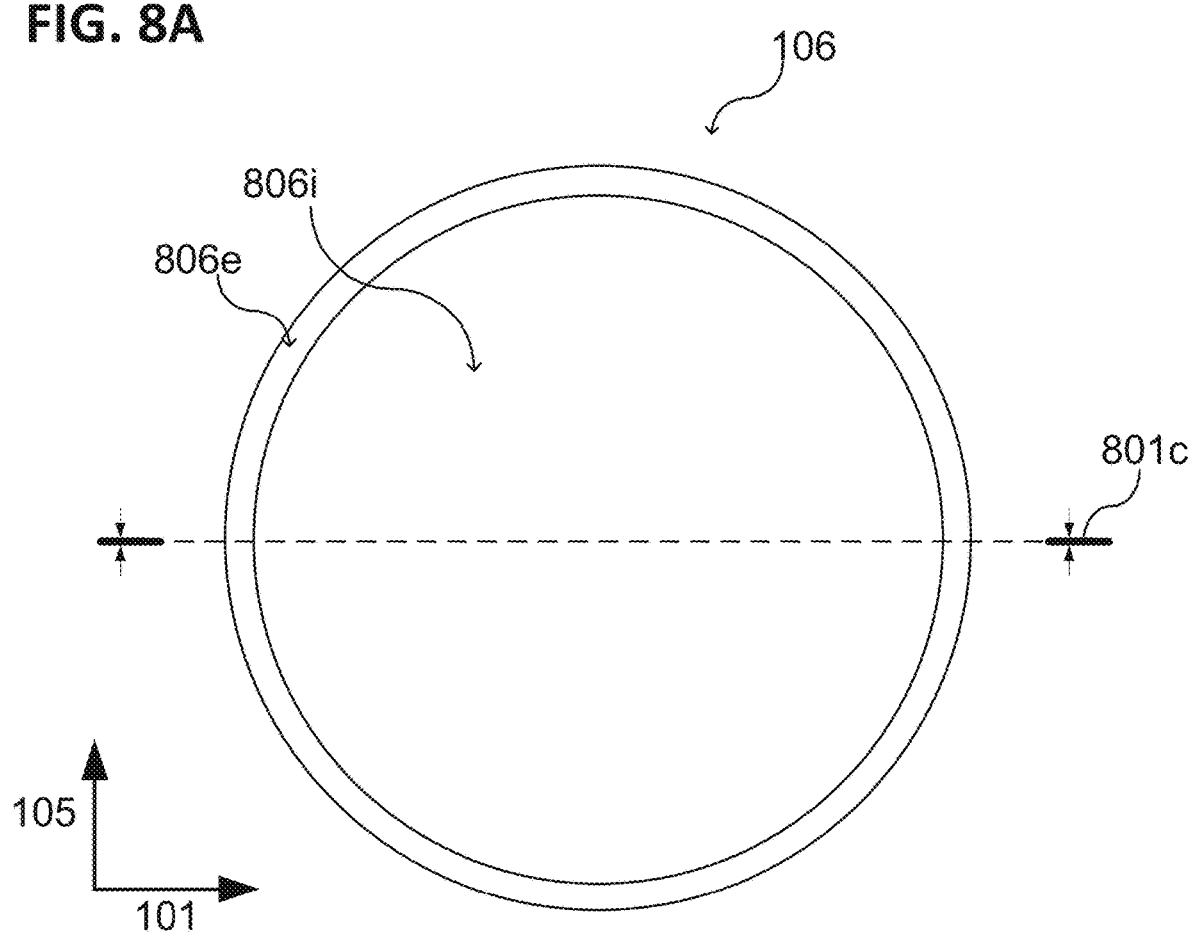
FIGS. 8A and 8B show a wafer to be supported by the wafer chuck in a schematic top view and a corresponding cross-sectional view, according to various embodiments.

According to various embodiments, the at least one support region 100s may include or may provide a support surface 102s configured to physically contact an edge surface of the wafer 106, as illustrated in FIG. 1C in a schematic cross-sectional view (see also the edge surface 806e illustrated in FIG. 8A).

According to various embodiments, the wafer chuck 100 may further include a boundary structure 104 surrounding the receiving area 102. The boundary structure 104 may be configured to retain the wafer 106 in the receiving area 102. According to various embodiments, the boundary structure 104 may define a maximal diameter 101d-1 of the wafer 106 to be received in the receiving area 102. Further, the at least one support region 100s (e.g. the at least one support surface 102s) defines a minimal diameter 101d-2 of the wafer 106 to be received in the receiving area 102.

According to various embodiments, as illustrated for example in FIG. 1A, the boundary structure 104, the central cavity 100c, and the at least one support region 100s may be concentrically arranged. A concentric arrangement may also be provided for other shapes, e.g. to support a wafer having a square shape, and the like.

According to various embodiments, the central cavity 102 may be provided by a single recessed region 100r. In other words, the wafer chuck 100 may have only a single central cavity 102 surrounded by the support region 100s. The single recessed region 100r is surrounded by the at least one support region. In the case that the wafer 106 is in the receiving area 102, the central cavity 102 completely exposes an entire inner region 106i of the wafer 106, e.g. at the front side 106f of the wafer facing the wafer chuck 100. The central cavity 102 may include a bottom surface 100f facing the receiving area 100r.

According to various embodiments, the at least one support region 100s and the recessed region 100r may be formed at least one of over or in a baseplate 110. In other words, the wafer chuck 100 may include a baseplate 110.

As illustrated in FIG. 1C, a wafer 106 may be placed in the receiving area 102 of the wafer chuck 100. The wafer 106 may include an edge region 106e surrounding a single inner region 106i of the wafer. Further, the wafer 106 may include a first surface 106f (also referred to herein as front side of the wafer) and a second surface 106b (also referred to herein as backside of the wafer) opposite to each other. Corresponding to the edge region 106e and the inner region 106i, the first surface 106f may include an edge surface region and an inner surface region.

According to various embodiments, the wafer 106 may be placed in the receiving area 102 of the wafer chuck 100 with the first surface 106f facing the wafer chuck 100 (or in other words facing the bottom surface 100f). In this case, the second surface 106b of the wafer 106 faces away from the wafer chuck 100. According to various embodiments, the first surface 106f of the wafer 106 may be partially in physical contact with the wafer chuck 100. For example, the edge surface region of the first surface 106f may be in physical contact with the at least one support surface 102s. In this case, the wafer 106 may be supported, or in other words carried, by the wafer chuck 100 only in an edge region 106e.

According to various embodiments, the wafer chuck 100 may be configured to support the wafer 106 only along an outer perimeter (e.g. only along the edge region 106e) of the wafer 106. Thus, the inner surface region of the first surface 106f may not have a physical contact to the wafer chuck 100. In other words, the surface of the entire inner region 106i facing the wafer chuck 100 may remain exposed (untouched) due to position and shape of the central cavity 100c. Therefore, a damaging of the inner region 106i of the wafer 106 can be avoided during processing the second surface 106b of the wafer 106. According to various embodiments, the second surface 106b (e.g. a backside) of the wafer may be processed in a processing tool, while the wafer 106 is received in the receiving area 102 of the wafer chuck 100.

The receiving area 102 may be defined by the at least one support surface 102s and by the boundary structure 104. Therefore, a pre-defined receiving position is provided by the wafer chuck 100, wherein the wafer 106 is supported in the pre-defined receiving position only in the edge region 106e of the wafer 106.

According to various embodiments, the area of the edge region (e.g. measured with respect to the first surface 106f or the second surface 106b of the wafer 106) may depend on the diameter of the wafer 106 and/or on the type of devices processed in the inner region 106i of the wafer 106. However, the edge region 106e may have an area proportion of less than 10% of the entire area of the first surface 106f. Accordingly, the inner region 106i (e.g. a device region or an active region) may have an area proportion of at least 90% of the first surface 106f. Therefore, the wafer chuck 100 may be configured to leave at least 90% of the first surface 106f exposed. According to various embodiments, no additional support is provided that contacts the inner region 106i of the wafer 106.

According to various embodiments, the support region 100s may be configured to support the edge region 106e of the wafer 106 and the recessed region 100r may be configured to leave the inner region 106i of the wafer 106 exposed. According to various embodiments, the wafer chuck 100 may include any suitable support structure for supporting the wafer 106 in the receiving area 102 as described herein.

Figure 1D:
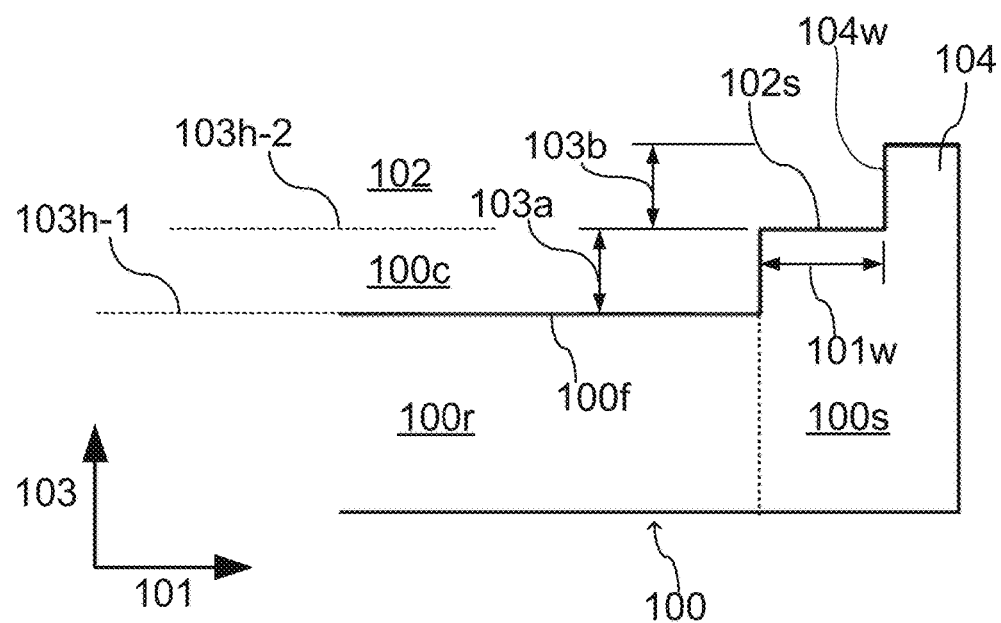
FIG. 1D shows a wafer chuck in a schematic cross-sectional view, according to various embodiments.

As illustrated in FIG. 1D in a schematic cross-sectional view, the bottom surface 100f of the recessed region 100r may be disposed below the at least one support surface 102s. In other words, a step with a first step height 103a is provided between the bottom surface 100f of the recessed region 100r and the at least one support surface 102s of the at least one support region 100r. The first step height 103a may be for example less than 1 mm, e.g. the first step height 103a may be in the range from about 50 µm to about 3 mm, e.g. in the range from about 50 µm to about 2 mm, e.g. in the range from about 50 µm to about 1 mm. As illustrated in FIG. 1D, the bottom surface 100f may be disposed at a first level (or in other words at a first height) 103h-1 less than a second level (or in other words a second height) 103h-2 of the at least one support surface 102s.

According to various embodiments, the boundary structure 106 may extend (e.g. along direction 103 illustrated in FIG. 1D) above the at least one support surface 102s. The height 103b of the boundary structure 104 may be in the range from about 10 µm to about 1 mm. According to various embodiments, the height 103b of the boundary structure 104 may be adapted to (e.g. may be substantially similar to or substantially the same as) a thickness of the wafer 106 to be placed in the receiving area 102 of the wafer chuck 100. According to various embodiments, the boundary structure 104 may include at least one sidewall 104w facing the receiving area 102.

According to various embodiments, the boundary structure 104 may define a maximal diameter of the wafer 106 to be received in the receiving area 102. Further, the at least one support surface 102s defines a minimal diameter of the wafer 106 to be received in the receiving area 102, since the wafer 106 has to physically contact the at least one support surface 102s with its edge region 106e. The width 101w of the at least one support surface (e.g. measured in radial direction) may be in the range from about 1 mm to about 5 mm. However, the width 101w of the at least one support surface may be adapted to the wafer 106 to be received in the receiving area 102, e.g. depending on the extension of the edge region 106e of the wafer 106.

According to various embodiments, the central cavity 100c provided by the recessed bottom surface 100f (or provided by any other suitable support structure) may have a diameter or lateral extension (e.g. e.g. along direction 101 or direction 105, e.g. in the plane perpendicular to direction 103) greater than about several centimeters.

According to various embodiments, the aspect ratio of the central cavity 100c (i.e. the height 103a of the central cavity 100c divided by the diameter 101d-2 or the lateral extension of the central cavity 100c) may be small, e.g. less than about 1/100 (i.e. less than about 1 percent).

According to various embodiments, at least one vent hole may be provided in the wafer chuck 100 for venting the central cavity 100c in the case that a wafer 106 is in the receiving area 102.

Figure 2A:
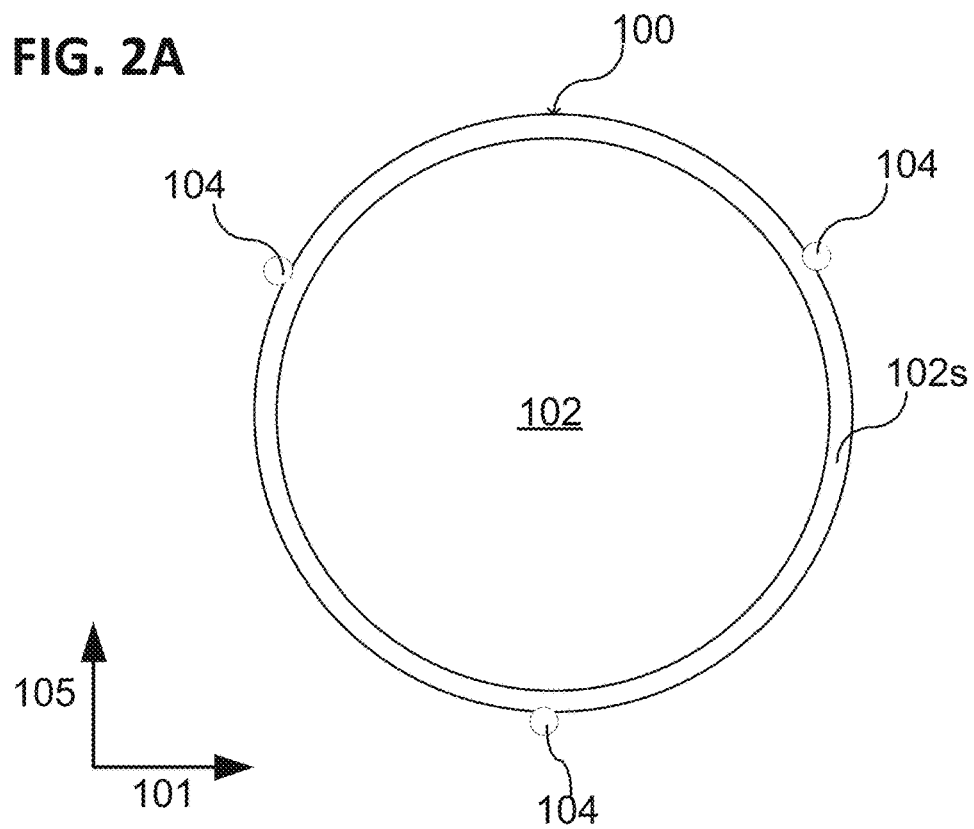
FIGS. 2A and 2B respectively show a wafer chuck in a schematic top view, according to various embodiments.
Figure 2B:
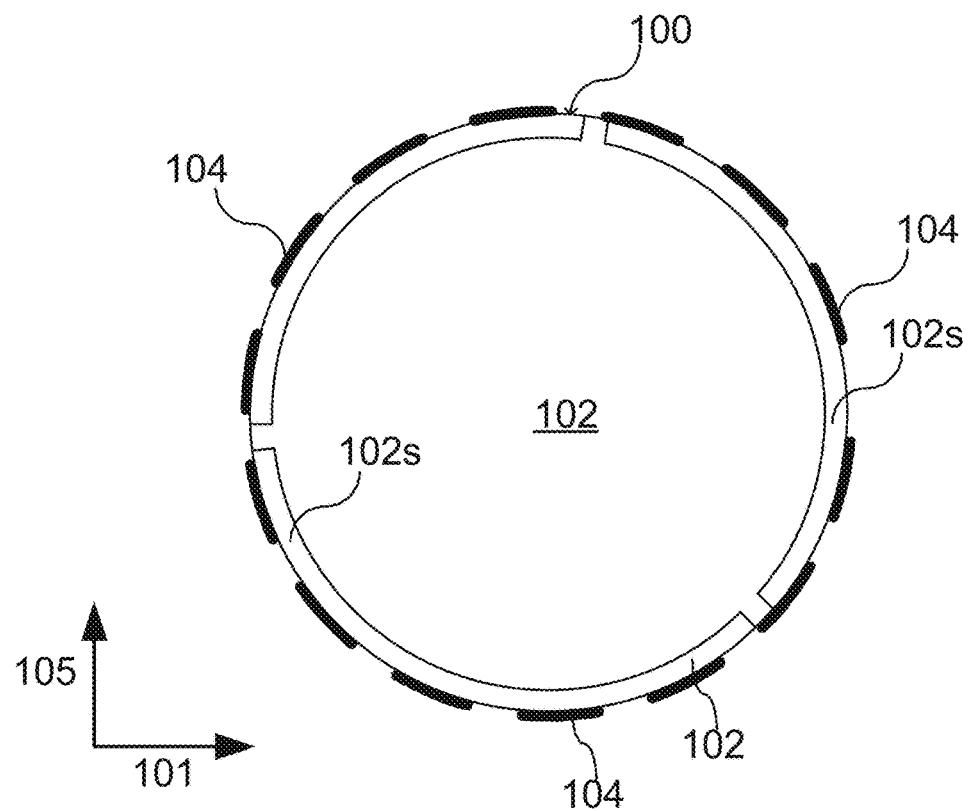

According to various embodiments, the boundary structure 104 may have a ring-shape as for example illustrated in FIG. 1A. However, the boundary structure 104 may have any other suitable shape. As for example illustrated in FIG. 2A and FIG. 2B, the boundary structure 104 may include one or more boundary elements arranged to limit a lateral movement of the wafer 106 in the receiving area 102. According to various embodiments, the boundary structure 104 may include three single boundary elements, as illustrated in FIG. 2A or may have a segmented ring-shape, as illustrated in FIG. 2B. However, the boundary structure 104 may include any other suitable shape.

According to various embodiments, the wafer chuck 100 may include a single support region 100s providing a single support surface 102s, e.g. in a ring-shape, as illustrated for example in FIG. 1A. However, the wafer chuck 100 may also include a plurality of support regions 100s or a segmented support region 100s providing a plurality of support surfaces 102s. The at least one support surface (e.g. the one or more support surfaces) 102s may have a planar shape. In other words, the plurality of support surfaces 102s provided by a plurality of corresponding support elements may be aligned coplanar.

Figure 3A:
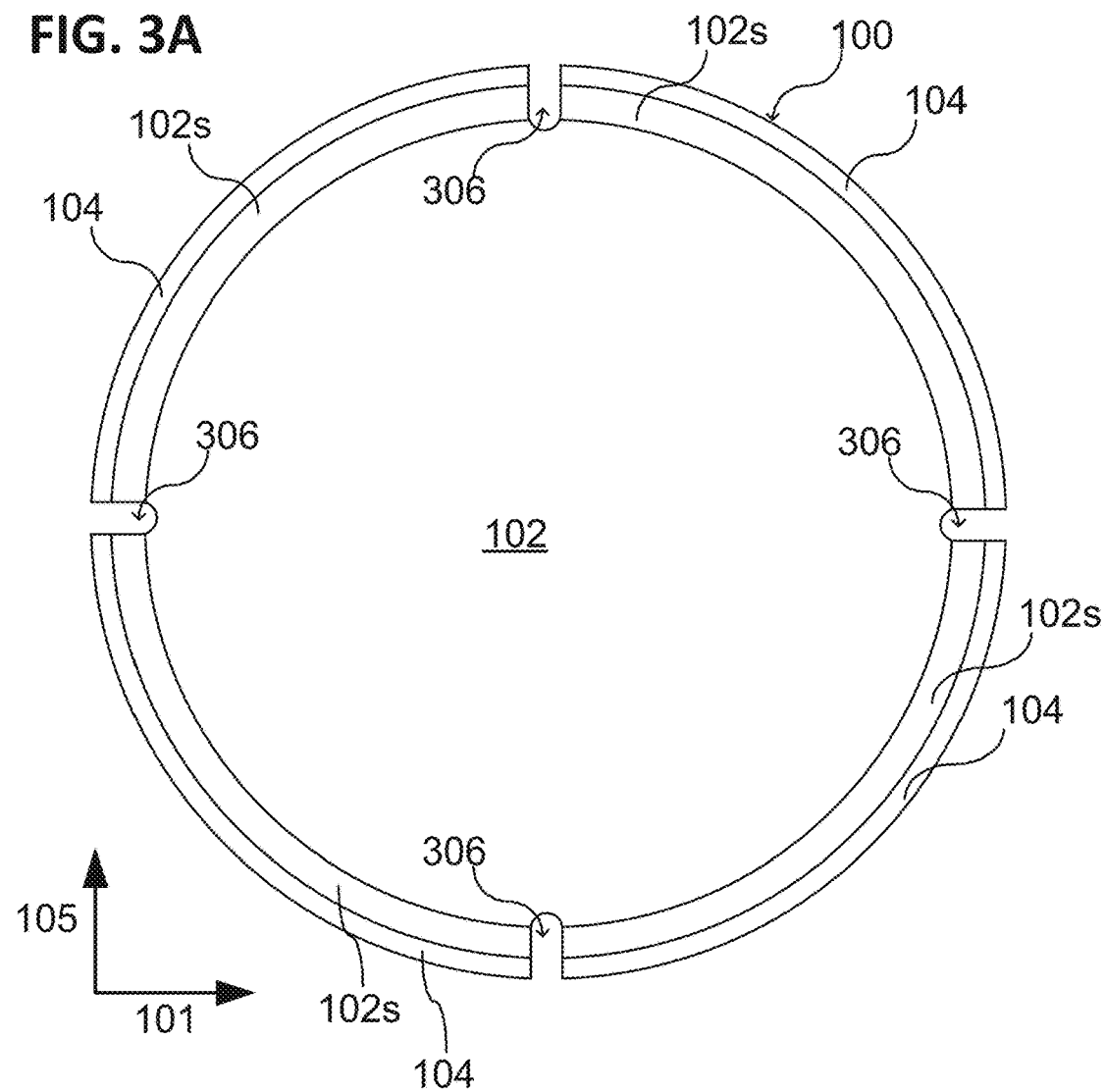
FIGS. 3A and 3B show a wafer chuck in a schematic top view and a corresponding cross-sectional view, according to various embodiments.

As illustrated in FIG. 3A in a schematic top view, the wafer chuck 100 may further include a plurality of notches 306 to provide an access to the receiving area 102 for a wafer handler 310 to lower the wafer 106 into the receiving area 102 and to raise the wafer 106 out of the receiving area 102. According to various embodiments, each of the notches 306 may extend from an outer circumference of the wafer chuck 100 (e.g. radially) into the wafer chuck 100.

According to various embodiments, each of the notches 306 may extend laterally through the support region 100s into the receiving area 102 and/or into the central cavity 100c. In this case, the plurality of notches 306 may be configured to provide one or more vent holes for venting the central cavity 100c.

According to various embodiments, the plurality of notches may be configured to host lift pins of a wafer handler (see FIG. 3C) to lower the wafer 106 into the receiving area 102 and to raise the wafer 106 out of the receiving area 102.

Figure 3B:
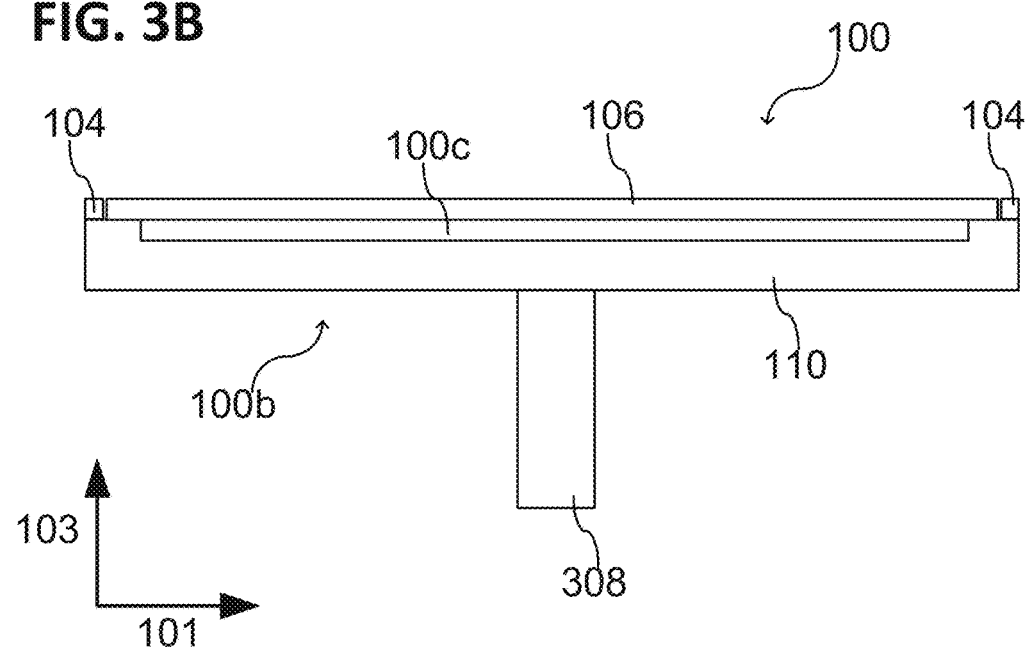

As illustrated in FIG. 3B in a schematic cross-sectional view, the wafer chuck 100 may further include a mounting flange 308 at a side 100b opposite the receiving area 102. The mounting flange 308 may be configured to allow mounting the wafer chuck 102 in a processing tool.

Figure 3C:
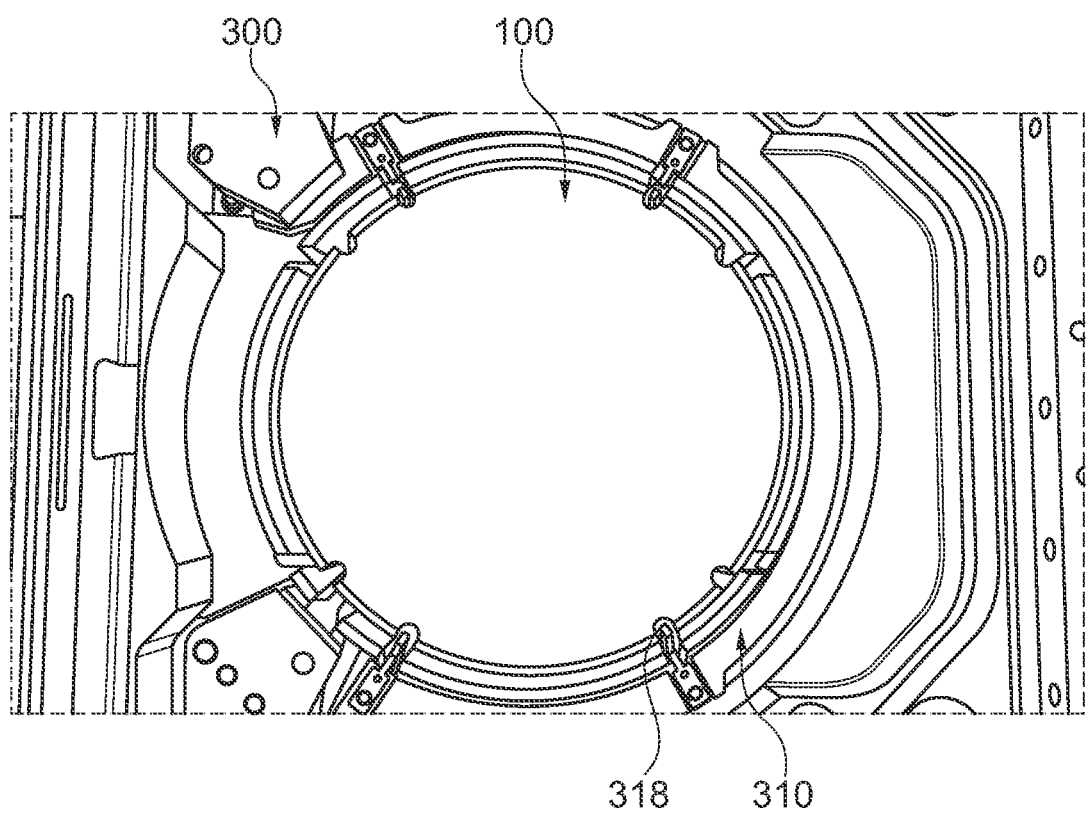
FIG. 3C shows a wafer chuck in a processing tool in a top view image, according to various embodiments.

As illustrated in FIG. 3C, a processing tool 300 may include a wafer handler 310 for wafer handling. The wafer chuck 100 may be mounted inside of the processing tool 300, e.g. via the mounting flange 308 or in any other suitable way. In this case, a plurality of lift pins 318 may be provided extending radially into the plurality of notches 306 of the wafer chuck 100. The wafer handler 310 may be configured to physically contact the wafer 106 only in its edge region 106e. The wafer chuck 100 may be movably mounted in in the processing tool 300.

According to various embodiments, the wafer 106 may be subjected to mechanical stress causing a wafer bow. The mechanical stress may be caused by film stress, temperature stress and/or a different pressure in the gap compared to the processing chamber. Further, in the case that the wafer 106 is relatively thin compared to the diameter of the wafer 106 (e.g. if the wafer 106 is for example less than about 200 μm thick and has a diameter greater than about 15 cm) the wafer may have a bow downwards due to gravity, if the wafer 106 is positioned in the receiving area 102, since the wafer 106 is only supported in its edge region 106e. Illustratively, the wafer may be flexible and bend downwards due to gravity.

According to various embodiments, the distance between the bottom surface 100f of the central cavity 102 and at least one of the first surface 106f or the second surface 106b of the wafer 106 may be important for obtaining optimal processing results using the wafer chuck 100 in a processing tool. For example, a plasma process may be carried out while the wafer 106 is positioned in the receiving area 102 of the wafer chuck 100 to process the second surface 106b of the wafer. In this case, according to various embodiments, the wafer chuck 100 or at least a part of the wafer chuck 100 (e.g. a baseplate 110 of the wafer chuck 100) may be used as an electrode. Therefore, an electrical potential may be applied at the wafer chuck 100 to generate an electrical field. To provide the electrical field homogeneously at the wafer 106, the distance between the bottom surface 100f and the second surface 106b of the wafer 106 may be substantial equal for any point across the inner region 106i of the wafer 106. To provide the electrical field homogeneously at the wafer 106, the distance between the bottom surface 100f and the second surface 106b of the wafer 106 may be substantial equal for any point across the inner region 106i of the wafer 106. To avoid a plasma generation by the electrical field in the central cavity 100c, the distance between the bottom surface 100f and the first surface 106f of the wafer 106 may be less than about 1 mm for any point across the inner region 106i of the wafer 106. The distance between two surfaces is measured for example geometrically always as the shortest distance, e.g. measured perpendicular to the surfaces. Further, to avoid spikes in the electrical field density at sharp corners or edges, corners and edges facing the central cavity 100c and/or the receiving area 102 may be rounded.

To consider a wafer bow in this case, the bottom surface 100f may be provided in a shape matching the wafer bow, e.g. with a surface curvature. According to various embodiments, the bottom surface 100f of the recessed region 100r may have a curved shape, e.g. a concave-shape or a convex-shape, as illustrated in FIGS. 4A to 5B in various cross-sectional views.

Figure 4A:
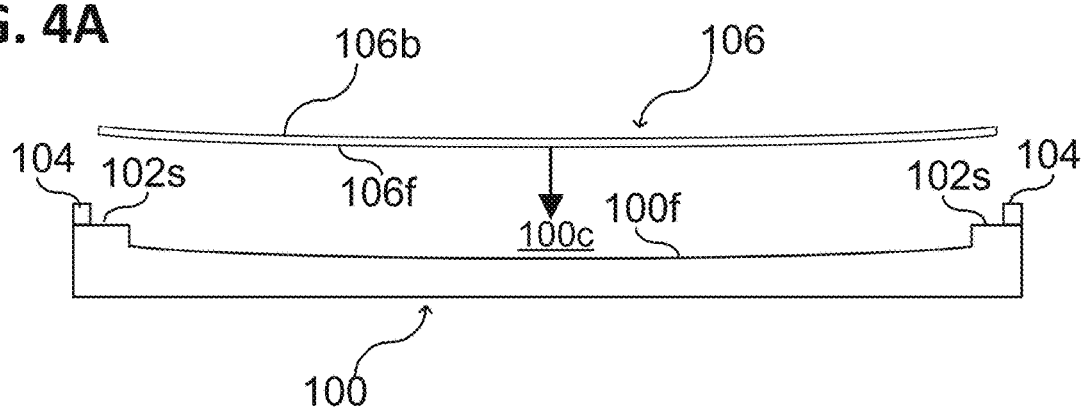
FIGS. 4A to 4C show a wafer chuck and a wafer placed on the wafer chuck in a schematic cross-sectional view, according to various embodiments.
Figure 4B:
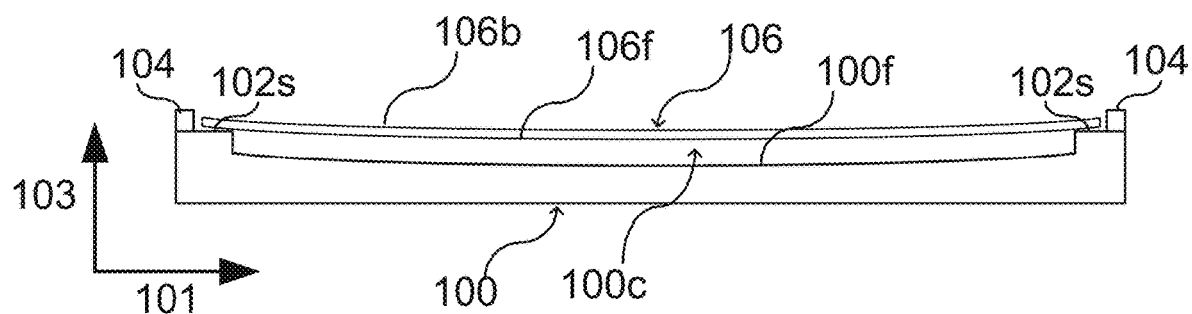

As illustrated in FIG. 4A and FIG. 4B, a wafer bow of the wafer 106 may be compensated by providing the bottom surface 100f in a concave-shape with reference to the wafer chuck 100. When the wafer 106 is the receiving area 102, the bottom surface 100f of the recessed region 100r is equidistantly arranged relative to the inner surface region of the first surface 106f the wafer 106. Illustratively, the first surface 106f of the wafer 106 and the bottom surface 100f may have the same shape, e.g. the same surface curvature or, in other words, the same bow.

Figure 4C:
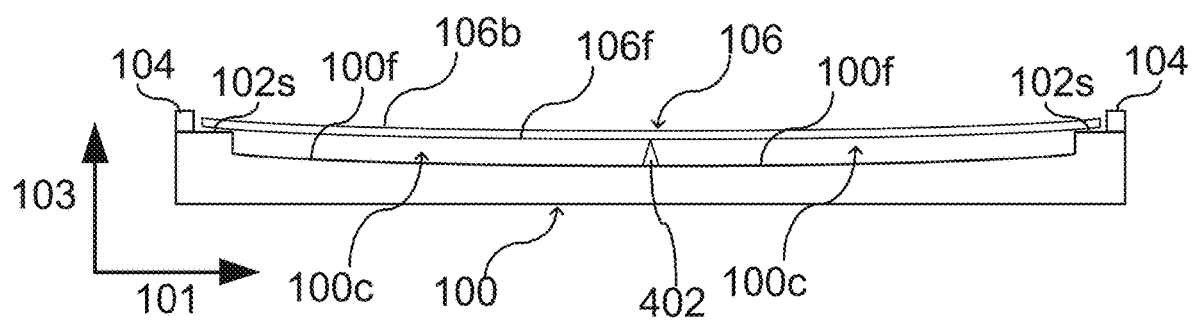

As illustrated in FIG. 4C in a schematic cross-sectional view, the wafer 106 may be supported in this arrangement by an additional support structure 402 (e.g. including one or more additional support elements) disposed in the central cavity 100c. The additional support structure 402 may protrude from the bottom surface 100f. According to various embodiments, the additional support structure 402 may be configured to physically contact the wafer 106 at the first surface 106f, e.g. in a kerf region (or any other unproductive region) disposed between two adjacent active regions of the wafer 106.

Figure 5A:
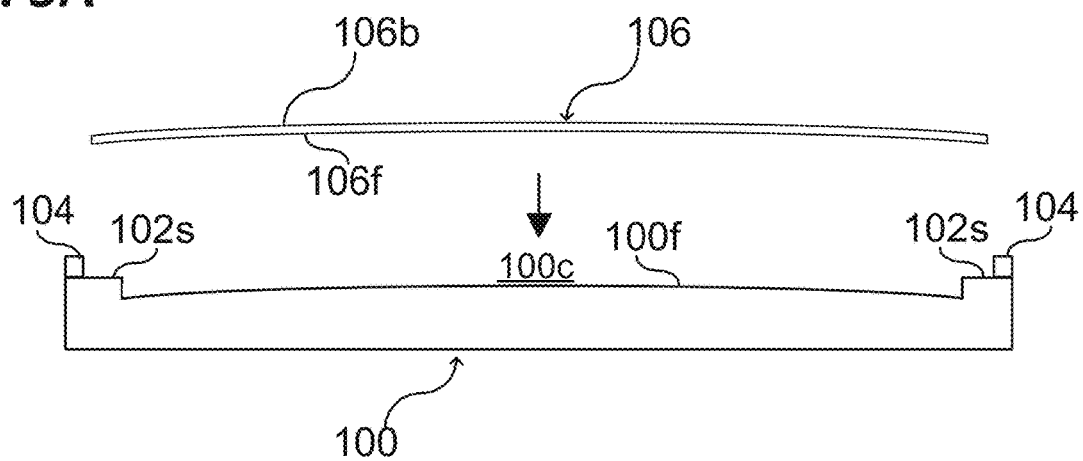
FIGS. 5A to 5C show a wafer chuck and a wafer placed on the wafer chuck in a schematic cross-sectional view, according to various embodiments.
Figure 5B:
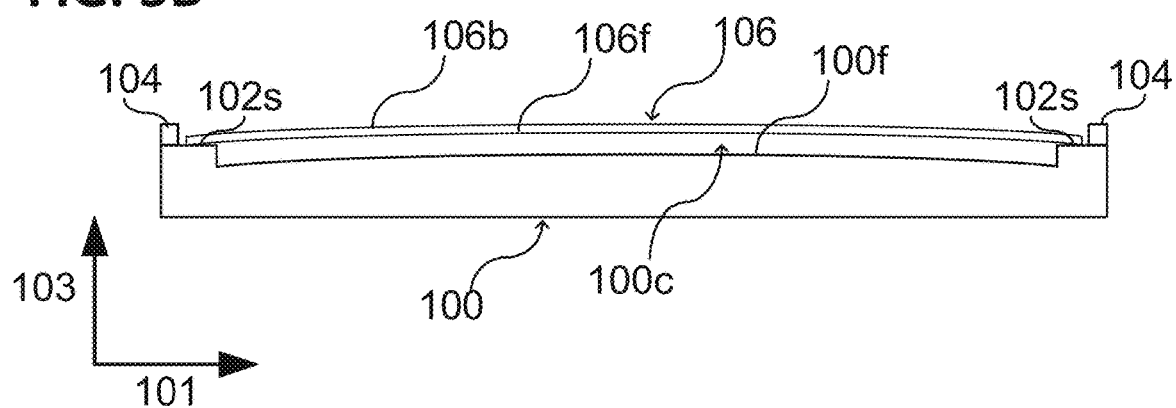

As illustrated in FIG. 5A and FIG. 5B, the wafer bow may be compensated by providing the bottom surface 100f in a convex-shape with reference to the wafer chuck 100. In the case that the wafer 106 is in the receiving area 102, the bottom surface 100f of the recessed region 100r is equidistantly arranged relative to the inner surface region of the first surface 106f the wafer 106. Illustratively, the first surface 106f of the wafer 106 and the bottom surface 100f may have the same shape, e.g. the same surface curvature or, in other words, the same bow. According to various embodiments, the wafer 106 may have a homogeneous thickness, so that also the second surface 106b of the wafer 106 is equidistantly arranged relative to the bottom surface 100f.

Figure 5C:
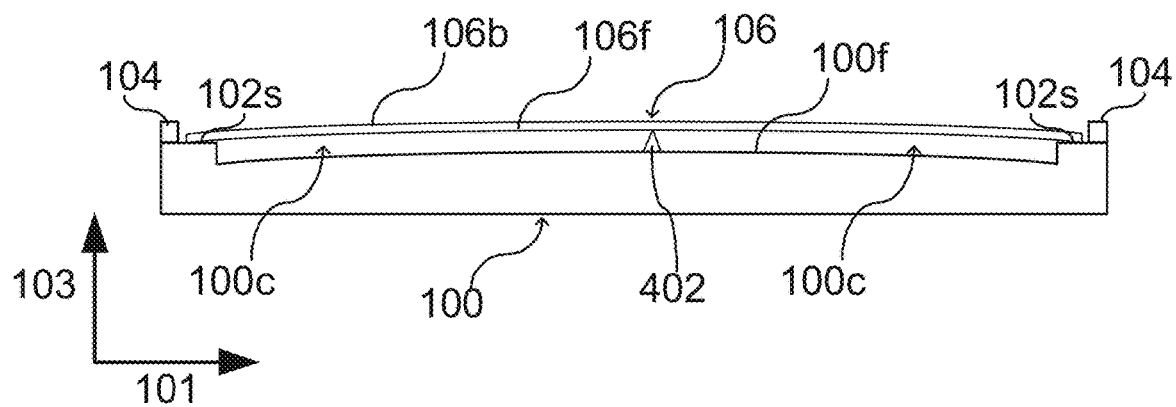

As illustrated in FIG. 5C in a schematic cross-sectional view, the wafer 106 may be supported in this arrangement by an additional support structure 402 (e.g. including one or more additional support elements) disposed in the central cavity 100c. The additional support structure 402 may protrude from the bottom surface 100f. According to various embodiments, the additional support structure 402 may be configured to physically contact the wafer 106 at the first surface 106f, e.g. in a kerf region (or any other unproductive region) disposed between two adjacent active regions of the wafer 106.

In the equidistant arrangement, the bottom surface 100f of the recessed region 100r is arranged relative to the exposed first surface 106f of the wafer 106, so that the spacing between the bottom surface 100f and the exposed proportion of the first surface 106f (also referred to as inner surface region 806i) is equidistant. The central cavity 100c (also referred to as gap) between the bottom surface 100f and the exposed proportion of the first surface 106f may be equidistant at any two opposite points. The bottom surface 100f and the exposed proportion of the first surface 106f may be substantially equidistant at any two opposing points, with the distance between the bottom surface and the surfaces subject to a tolerance of, e.g., less than 20 percent of the distance, less than 10 percent of the distance, or less than 5 percent of the distance. The distance between the bottom surface 100f and the exposed proportion of the first surface 106f may be common (the same) at all points.

FIG. 6 illustrates a schematic flow diagram of a method 600 for processing a wafer 106, see also FIGS. 4A to 5B. According to various embodiments, the method 600 may include: in 610, determining a wafer bow of a wafer 106 under conditions that the wafer 106 is only supported in an edge region 106e of the wafer 106 via a support region 100s of a wafer chuck 100, wherein the wafer chuck 100 includes a recessed region 100r surrounded by the support region 100s, the recessed region 100r including a bottom surface 100f facing the wafer 106 and providing a central cavity 100c between the bottom surface 100f of the recessed region 100r and an inner region 106i of the wafer 106 surrounded by the edge region 106e of the wafer 106; and, in 620, adapting a shape of the bottom surface 100f based on the determined wafer bow to provide an equidistantly arrange the inner region 106i of the wafer 106 relative to the bottom surface 100f of the recessed region 100r in the case that the wafer 106 is placed on the wafer chuck 100.

According to various embodiments, the method 600 may further include placing the wafer 106 on the wafer chuck 100. Thereby, the wafer 106 may be received in a receiving area 102 of the wafer chuck 100 provided by the recessed region 100r and the support region 100s of the wafer chuck 100. According to various embodiments, the method 600 may further include positioning the wafer 106 in a processing region of a plasma-processing tool via the wafer chuck 100.

Figure 7:
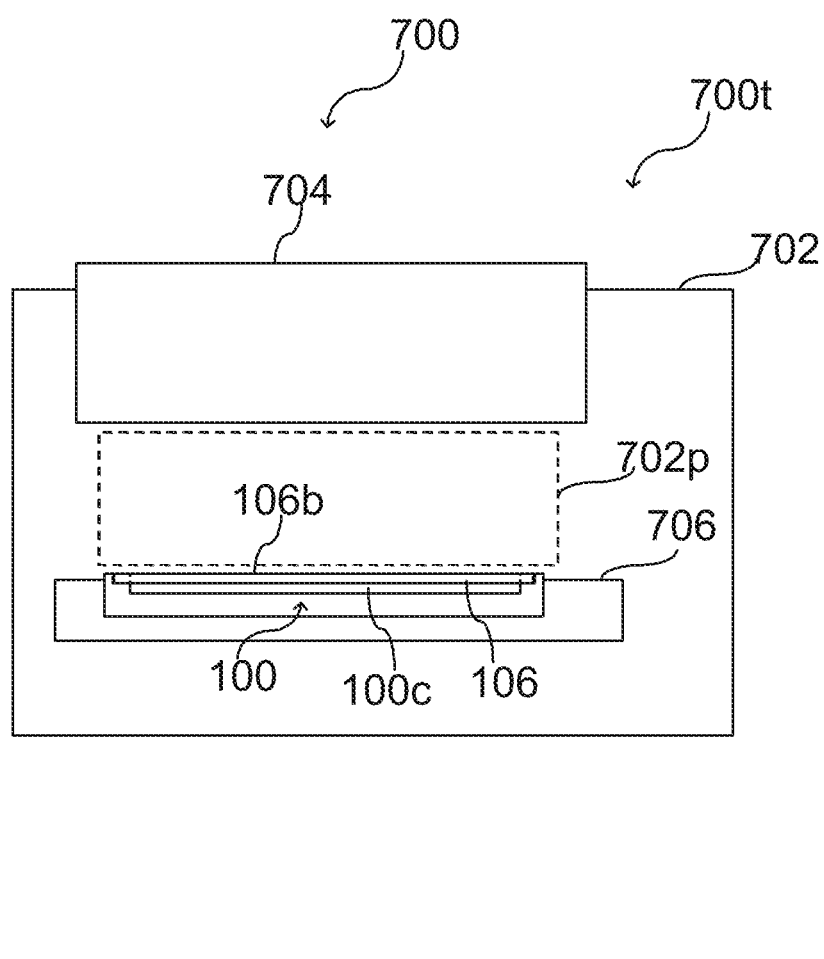
FIG. 7 shows a schematic view of a processing arrangement for processing a wafer, according to various embodiments.

FIG. 7 illustrates a schematic view of a processing arrangement 700 including a processing tool 700t for processing the wafer 106. According to various embodiments, the processing tool 700t may include a processing chamber. The processing tool 700t may be configured as plasma-processing tool to process the wafer 106 via a plasma. The plasma may be generated in a processing region 702p of the processing chamber 702. The processing chamber 702 may be a vacuum chamber to provide a vacuum in the processing region 702p. According to various embodiments, a pressure in the range from about 1 Torr to about 400 Torr may be provided in the processing region 702p of the processing chamber 702.

According to various embodiments, a plasma generator 704, e.g. an ICP source, a CCP source, a remote plasma source, etc., may be used to provide a plasma in the processing region 702p.

The processing tool 700t may be configured to deposit a material layer on the second surface 106b (e.g. over the backside) of the wafer 106. Alternatively, the processing tool 700t may be configured to allow any other suitable processing of the second surface 106b of the wafer 106, e.g. a plasma etching, a plasma cleaning, a plasma resist ashing, and the like.

According to various embodiments, during processing, a voltage may be applied at the wafer chuck 100, e.g. a bias voltage, or at least one of an AC or DC voltage to generate a plasma in the processing region 702p.

According to various embodiments, the processing tool 700t may further include a gas supply to provide a processing gas in the processing region 702p. The processing gas may include, for example, a pre-cursor gas for a (e.g. plasma assisted) chemical vapor deposition. Alternatively, the processing gas may include an etchant for a plasma-based etch process.

According to various embodiments, the wafer chuck 100 may be configured to avoid surface-electric-field spikes induced by a sharp edge or corner. According to various embodiments, the wafer chuck 100 may include rounded edges or rounded corners. According to various embodiments, the one or more support elements that provide the one or more support surfaces around the central cavity 100c of the recessed region 101r may have a rounded edge facing the wafer 106. According to various embodiments, the notches 306 may have rounded edges as well.

According to various embodiments, the processing arrangement 700 may include a wafer handler 706, e.g. disposed within the processing chamber, as described before.

Figure 8B:
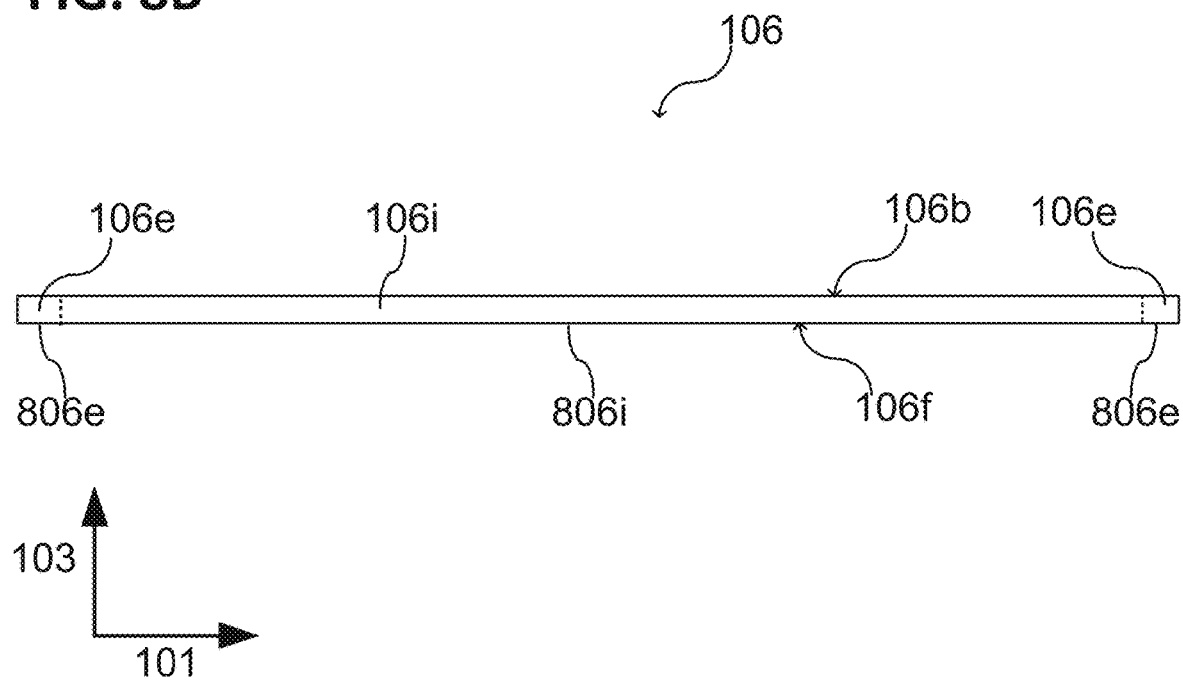

FIG. 8A illustrates wafer 106 to be supported by the wafer chuck 100 in a schematic top view and FIG. 8B shows a corresponding cross-sectional view of the wafer 106 along the cross-section line 801c, according to various embodiments. The edge region 106e of the wafer 106 may (e.g. completely) laterally surround the inner region 106i of the wafer 106, as described above. The first surface 106f of the wafer 106 may have an edge surface region 806e and an inner surface region 806i accordingly, as described above.

According to various embodiments, the wafer chuck 100 described herein may be used efficiently in a CVD-processing tool, e.g. in a PE-CVD or SA-CVD processing tool, for processing a backside of a wafer.

According to various embodiments, a heater structure (e.g. a resistance heater) may be integrated on and/or in the wafer chuck 100. The heater structure may be disposed in the recessed region 100r below or at the bottom surface 100f. Alternatively, a lamp heater may be used, e.g. disposed in a processing tool below the wafer chuck 100, to heat the wafer chuck 100 via radiation (e.g. light) from the backside of the wafer chuck 100.

Various examples are described in the following referring to the embodiments provided above.

Example 1 is a wafer chuck 100 including: a baseplate 110 including a receiving area 102 for receiving a wafer 106, the baseplate 110 including at least one support surface 102s to support the wafer 106 in the receiving area 102, wherein the at least one support surface 102s is configured to physically contact the wafer 106 only in an edge surface region 806e of a surface of the wafer 106 facing the baseplate 110 and to leave an entire inner surface region 806i of the surface 106f surrounded by the edge surface region 806e exposed; and a boundary structure 104 at least partially laterally surrounding the receiving area 102.

Alternatively, Example 1 is a wafer chuck 100 including: a baseplate 110 with a receiving area 102 for receiving a wafer 106 with a surface 106f of the wafer 106 facing the baseplate 110, at least one support surface 102s to support the wafer 106 in the receiving area 102, the at least one support surface 102s is configured to physically contact the surface 106f of the wafer in an edge surface region 806e and to expose an entire inner surface region 806i of the surface 106f surrounded by the edge surface region; and a boundary structure 104 at least partially laterally surrounding the receiving area 102.

In Example 2, the wafer chuck of Example 1 may optionally include that the boundary structure 104 extends above the at least one support surface 102s.

In Example 3, the wafer chuck of Example 1 or 2 may optionally include that the boundary structure 104 defines a maximal diameter 101d-1 of the wafer 106 to be received in the receiving area 102. Further, the at least one support surface 102s defines a minimal diameter 101d-2 of the wafer 106 to be received in the receiving area 102.

In Example 4, the wafer chuck of any one of Examples 1 to 3 may optionally include that the boundary structure 104 and the at least one support surface 102s are concentrically arranged. Illustratively, the boundary structure 104 and the at least one support surface 102s are disposed in a concentric arrangement.

In Example 5, the wafer chuck of any one of Examples 1 to 4 may optionally include that the at least one support surface 102s is provided by a recessed region 100r, wherein the recessed region includes a central cavity 100c with a bottom surface 100f at a level (or in other words at a height) less than a level of the at least one support surface 102s.

In Example 6, the wafer chuck of Example 5 may optionally include that the recessed region 100r includes a single central cavity 100c over the bottom surface 100f to leave the entire inner region 106i (in other words the inner surface region 806i facing the wafer chuck 100) of the wafer 106 exposed.

In Example 7, the wafer chuck of Example 5 or 6 may optionally include that the bottom surface 100f of the recessed region 100r has a curved shape. The bottom surface 100f of the recessed region 100r may have a concave-shape or a convex-shape.

In Example 8, the wafer chuck of any one of Examples 1 to 7 may optionally include that the baseplate 110 includes electrically conductive material to apply a voltage at the baseplate 110 for generating an electrical field.

In Example 9, the wafer chuck of any one of Examples 1 to 8 may optionally include that the baseplate 110 is partially or completely covered with a protection material. The protection material may include a ceramic material, e.g. a metal oxide.

In Example 10, the wafer chuck of any one of Examples 1 to 9 may optionally further include a plurality of notches 306 extending from an outer circumference of the baseplate 110 into the baseplate 110.

In Example 11, the wafer chuck of Example 10 may optionally include that the plurality of notches 306 is configured to host lift pins of a wafer handler to lower the wafer 106 into the receiving area 102 and to raise the wafer 106 out of the receiving area 102.

In Example 12, the wafer chuck of any one of Examples 1 to 11 may optionally further include a mounting flange 308 disposed at a side 100b of the baseplate 110 opposite the receiving area 102 for mounting the wafer chuck 100 in the processing tool.

Example 13 is a processing arrangement including: a processing tool 700t for processing a wafer 106 in a processing region 702p of the processing tool 700t; and a wafer chuck 100 of any one of Examples 1 to 12 to position the wafer in the processing region 702p. According to various embodiments, the processing tool 700t may be a plasma-processing tool.

Example 14 is a processing arrangement 700 including: a processing tool 700t for processing a wafer 106 in a processing region 702p of the processing tool 700t; a wafer chuck 100 to position (e.g. to carry) the wafer in the processing region 702p; the wafer chuck 100 including: a baseplate 110 including a receiving area 102 for receiving the wafer 106, the baseplate 110 including at least one support surface 102s to support the wafer 106 in the receiving area 102, wherein the at least one support surface 102s is configured to physically contact the wafer 106 only in an edge region 106e of the wafer and to completely expose an inner region 106i of the wafer 106 surrounded by the edge region 106e; and a boundary structure 104 at least partially laterally surrounding the receiving area 102.

In Example 15, the processing arrangement of Example 14 may optionally include that the processing tool 700t is a plasma-processing tool.

In Example 16, the processing arrangement of Example 15 may optionally further include a plasma generator 704 configured to provide a plasma in the processing region 702p.

In Example 17, the processing arrangement of any one of Examples 14 to 16 may optionally further include a vacuum chamber 702 configured to provide a vacuum in the processing region 702p.

In Example 18, the processing arrangement of any one of Examples 14 to 17 may optionally further include a wafer handler 706 to lower the wafer 106 into the receiving area 102 and to raise the wafer 160 out of the receiving area 102.

In Example 19, the processing arrangement of Example 18 may optionally include that the wafer chuck 100 includes a plurality of notches 306 extending from an outer circumference of the baseplate 110 into the baseplate 110. Further, the wafer handler 706 may include a plurality of handling elements (e.g. lift pins) configured to be raised and lowered through the plurality of notches 306 to lower and raise the wafer 106.

In Example 20, the processing arrangement of any one of Examples 14 to 19 may optionally include that the baseplate 110 includes a recessed region 100r. Further, a bottom surface 100f of the recessed region 100r is disposed at a first level 103h-1 less than a second level 103h-2 of the at least one support surface 102s. In other words, the bottom surface 100f is recessed into the baseplate 110.

In Example 21, the processing arrangement of Example 20 may optionally include that the recessed region 100r provides a cavity 100c over the bottom surface 100f of the recessed region 100r to leave the inner region 106i of the wafer 106 exposed.

In Example 22, the processing arrangement of Example 20 or 21 may optionally include that the bottom surface 100f is curved. The bottom surface 100f may have a concave-shape or a convex-shape.

In Example 23, the processing arrangement of any one of Examples 20 to 22 may optionally further include: a wafer 106 in the receiving area 102, the wafer 106 including an inner region 106i and an edge region 106e surrounding the inner region 106i, wherein the bottom surface 100f of the recessed region 100r is equidistantly arranged relative to the inner region 106i of the wafer 106.

In Example 24, the processing arrangement of any one of Examples 14 to 23 may optionally include that the baseplate 110 includes electrically conductive material to apply a voltage at the baseplate 100. In other words, the wafer chuck 100 may be configured as an electrode. According to various embodiments, the wafer chuck 100 or the baseplate 110 of the wafer chuck 100 may be coupled to a plasma generator 704 or may be part of a plasma generator 704.

Example 25 is a method 600 for processing a wafer 106, the method including: determining a wafer bow of a wafer 106 under conditions that the wafer is only supported in an edge region 106e of the wafer 106 via a wafer chuck 100, wherein the wafer chuck 100 includes a recessed region 100r surrounded by a support region 100s, the recessed region 100r including a bottom surface 100f facing the wafer 106 and provides a cavity 100c between the bottom surface 100f and an inner region 106i of the wafer 106 surrounded by the edge region 106e; and adapting a shape of the bottom surface 100f of the recessed region 100r based on the determined wafer bow to provide an equidistant arrangement of the inner region 106i of the wafer 106 relative to the bottom surface 100f in the case that the wafer 106 is supported by the wafer chuck 100.

In Example 26, the method of Example 25 may optionally further include placing the wafer 106 on the wafer chuck 100.

In Example 27, the method of Example 26 may optionally further include positioning the wafer 106 in a processing region 702p of a processing tool 700t via the wafer chuck 100.

Example 28 is a wafer chuck including a support structure configured to support a wafer 106 so that the wafer 106 is only supported in an edge region 106e of the wafer.

Example 29 is a wafer chuck including: at least one support region 100s configured to support a wafer 106 in a receiving area 102; a central cavity 100c surrounded by the at least one support region 100s and configured to support the wafer 106 only along an outer perimeter; and a boundary structure 104 at least partially or completely surrounding the receiving area 102 and configured to retain the wafer 106 in the receiving area 102.

In Example 30, the wafer chuck of Example 29 may optionally include that the at least one support region 100s includes at least one support surface 102s configured to physically contact an edge surface region 806e (of an edge region 106e) of the wafer 106.

In Example 31, the wafer chuck of Example 29 or 30 may optionally include that the boundary structure 104 defines a maximal diameter 101d-1 for a wafer 106 to be received in the receiving area 102. Further, the at least one support region 100s may define a minimal diameter 101d-2 for a wafer to be received in the receiving area 102.

In Example 32, the wafer chuck of any one of Examples 29 to 31 may optionally include that the boundary structure 104, the central cavity 100c, and the at least one support region 100s are concentrically arranged.

In Example 33, the wafer chuck of Example 30 may optionally include that the central cavity 100c includes a bottom surface 100f disposed at a first level 103h-1 less than a second level 103h-2 of the at least one support surface 102s.

In Example 34, the wafer chuck of Example 33 may optionally include that the bottom surface 100f is curved.

In Example 35, the wafer chuck of any one of Examples 29 to 34 may optionally include that the central cavity 100c is provided by a single recessed region 100r. The single central cavity 100c completely exposes an inner surface region 806i (of an entire inner region 106i) of the wafer 106. The inner surface region 806i is surrounded by an edge surface region 806e (of an edge region 106e) of the wafer 106.

In Example 36, the wafer chuck of any one of Examples 29 to 35 may optionally further include a plurality of notches 306 extending from an outer circumference of the wafer chuck 100 into the wafer chuck 100.

In Example 37, the wafer chuck of Example 36 may optionally include that each of the plurality of notches 306 is configured to host a handling pin of a wafer handler to lower the wafer into the receiving area and to raise the wafer out of the receiving area.

In Example 38, the wafer chuck of any one of Examples 29 to 37 may optionally further include a mounting flange 308 at a side opposite the receiving area 102 to mount the wafer chuck 100 in a processing tool.

Example 39 is a processing arrangement 700 including: a processing tool 700t for processing a wafer 106 in a processing region 702p of a processing chamber 702; and a wafer chuck 100 of any one of Examples 29 to 38 to position the wafer 106 in the processing tool 700t.

Example 40 is a processing arrangement 700 including: a processing tool for processing a wafer in a processing region; a wafer chuck 100 to position the wafer 106 in the processing tool 700t; the wafer chuck 100 including: at least one support region 100s configured to support the wafer 106 in a receiving area 102 of the wafer chuck; a central cavity 100c surrounded by the at least one support region 100s and configured to support the wafer 106 only along an outer perimeter; and a boundary structure 104 surrounding the receiving area 102 and configured to retain the wafer 106 in the receiving area 102.

In Example 41, the processing arrangement of Example 40 may optionally include that the processing tool is a plasma-processing tool and that the wafer chuck 100 is configured as an electrode.

In Example 42, the processing arrangement of Example 40 or 41 may optionally further include a wafer handler 706 to lower the wafer 106 into the receiving area 102 and to raise the wafer 106 out of the receiving area 102.

In Example 43, the processing arrangement of Example 42 may optionally include that the wafer chuck 100 includes a plurality of notches 306 extending from an outer perimeter of the wafer chuck 100 into the wafer chuck 100, and that the wafer handler 706 includes a plurality of handling pins configured to be raised and lowered through the plurality of notches 306 to raise and lower the wafer 106.

In Example 44, the processing arrangement of any one of Examples 40 to 43 may optionally include that the central cavity 100c includes a bottom surface 100f disposed at a first level 103h-1 less than a second level 103h-2 of a support surface 102s of the at least one support region 100s.

In Example 45, the processing arrangement of Example 44 may optionally include that the central cavity 100c is provided by a single recessed region 100r. The single central cavity 100c completely exposes an inner surface region 806i (of an entire inner region 106i) of the wafer 106. The inner surface region 806i is surrounded by an edge surface region 806e (of an edge region 106e) of the wafer 106.

In Example 46, the processing arrangement of Example 44 or 45 may optionally include that the bottom surface is curved.

In Example 47, the processing arrangement of any one of Examples 44 to 46 may optionally further include a wafer 106 in the receiving area 102, wherein the bottom surface 100f of the cavity 100c is equidistantly arranged relative to at least one of a first surface 106f of the wafer 106 facing the wafer chuck 100 or a second surface 106b of the wafer 106 facing away from the wafer chuck 100.

Example 48 is a wafer chuck 100 including: a baseplate 110 including a receiving area 102 for receiving a wafer 106; a recessed region 100r disposed in the baseplate 110, the recessed region 100r is configured to provide a cavity 100c (e.g. below the receiving area 102) surrounded by at least one support region to support the wafer in the receiving area, wherein the cavity 100c includes a curved bottom surface 100f facing the receiving area 102. The at least one support region 100s may include a support surface 102s configured to physically contact an edge surface region 806e (of an edge region 106e) of the wafer 106.

Example 49 is a wafer chuck, including: a baseplate including a receiving area for receiving a wafer; and a recessed region disposed in the baseplate, the recessed region is configured to provide a cavity surrounded by at least one support region to support the wafer in the receiving area. The cavity includes a curved bottom surface facing the receiving area. Further, the wafer chuck includes an additional support structure at least partially disposed in the cavity to support the wafer over the cavity in the receiving area. The additional support structure may define a distance between the curved bottom surface and the wafer to be supported in the receiving area.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A processing arrangement comprising:
   a processing tool for processing a wafer in a processing region;
   a wafer chuck to position the wafer in the processing tool; the wafer chuck comprising:
   a support region configured to support the wafer in a receiving area;
   a central cavity surrounded by the support region configured to support the wafer only along an outer perimeter; and
   a boundary structure surrounding the receiving area configured to retain the wafer in the receiving area;
   wherein the central cavity comprises a bottom surface disposed at a first level less than a level of a first support surface of the support region;
   wherein the bottom surface is curved;
   wherein the first support surface is configured to support a lower surface of the wafer, wherein the first support surface is oriented parallel to a lateral extension of the wafer chuck; wherein the support region further comprises a second support surface, configured to support a side surface of the wafer, wherein the second support surface is oriented perpendicularly to the lateral extension of the wafer chuck.

2. The processing arrangement of claim 1, wherein the processing tool is a plasma-processing tool.

3. The processing arrangement of claim 1, further comprising:
   a wafer handler to lower the wafer into the receiving area and to raise the wafer out of the receiving area.

4. The processing arrangement of claim 3, wherein the wafer chuck comprises a plurality of notches extending from an outer perimeter of the wafer chuck into the wafer chuck,
   wherein the wafer handler comprises a plurality of handling pins configured to be raised and lowered through the plurality of notches to raise and lower the wafer.

5. The processing arrangement of claim 1, wherein the central cavity is provided by a single recessed region.

6. The processing arrangement of claim 1, further comprising:
   a wafer in the receiving area, wherein the bottom surface of the central cavity is equidistantly arranged relative to a surface of the wafer facing the wafer chuck or facing away from the wafer chuck.

7. The processing arrangement of claim 1, wherein the wafer chuck is configured as an electrode, and wherein the wafer chuck being configured as an electrode comprises at least the baseplate of the wafer chuck being made of an electrically conductive material, wherein the baseplate is configured to receive an electric potential and to generate an electric field.

8. A wafer chuck, comprising:
   a baseplate comprising a receiving area for receiving a wafer; and
   a recessed region disposed in the baseplate, the recessed region configured to provide a cavity surrounded by a support region to support the wafer in the receiving area, wherein the cavity comprises a curved bottom surface facing the receiving area;
   wherein the support region comprises a first support surface, configured to support a lower surface of the wafer, wherein the first support surface is oriented parallel to a lateral extension of the wafer chuck; and wherein the support region further comprises a second support surface, configured to support a side surface of the wafer, wherein the second surface is oriented perpendicularly to the lateral extension of the wafer chuck.

9. The wafer chuck of claim 8, further comprising:
   an additional support structure at least partially disposed in the cavity and configured to support the wafer in the receiving area.

* * * * *

UNITED STATES PATENT AND TRADEMARK OFFICE
CERTIFICATE OF CORRECTION

PATENT NO. : 11,387,081 B2
APPLICATION NO. : 16/798445
DATED : July 12, 2022
INVENTOR(S) : Rudolf Kogler et al.

It is certified that error appears in the above-identified patent and that said Letters Patent is hereby corrected as shown below:

In the Claims

Claim 8 Column 18, Line 56, --support-- should be inserted between second and surface.

Signed and Sealed this
Twenty-seventh Day of September, 2022

Katherine Kelly Vidal
*Director of the United States Patent and Trademark Office*